(12) United States Patent
Zhang et al.

(10) Patent No.: US 10,553,485 B2
(45) Date of Patent: Feb. 4, 2020

(54) METHODS OF PRODUCING FULLY SELF-ALIGNED VIAS AND CONTACTS

(71) Applicant: Micromaterials LLC, Wilmington, DE (US)

(72) Inventors: Ying Zhang, Santa Clara, CA (US); Regina Freed, Los Altos, CA (US); Nitin K. Ingle, Santa Clara, CA (US); Ho-yung Hwang, Cupertino, CA (US); Uday Mitra, Cupertino, CA (US); Abhijit Basu Mallick, Palo Alto, CA (US); Sanjay Natarajan, Portland, OR (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/015,714

(22) Filed: Jun. 22, 2018

(65) Prior Publication Data

US 2018/0374750 A1    Dec. 27, 2018

Related U.S. Application Data

(60) Provisional application No. 62/524,527, filed on Jun. 24, 2017, provisional application No. 62/657,873, filed on Apr. 15, 2018.

(51) Int. Cl.
*H01L 21/768* (2006.01)
*H01L 21/67* (2006.01)
*H01L 21/3213* (2006.01)

(52) U.S. Cl.
CPC .. *H01L 21/76897* (2013.01); *H01L 21/67138* (2013.01); *H01L 21/76802* (2013.01);
(Continued)

(58) Field of Classification Search
CPC ......... H01L 21/0337; H01L 21/76802–76837; H01L 21/76897; H01L 21/67138;
(Continued)

(56) References Cited

U.S. PATENT DOCUMENTS 4,671,970 A    6/1987 Keiser et al.
5,824,597 A    10/1998 Hong
(Continued)

FOREIGN PATENT DOCUMENTS

JP    2008108757 A    5/2008
JP    2011060803 A    3/2011
(Continued)

OTHER PUBLICATIONS

PCT International Search Report and Written Opinion in PCT/US2017/037141 dated Aug. 31, 2017, 11 pages.
(Continued)

*Primary Examiner* — Eric A. Ward
(74) *Attorney, Agent, or Firm* — Servilla Whitney LLC

(57) ABSTRACT

Methods and apparatus to form fully self-aligned vias are described. First conductive lines are recessed in a first insulating layer on a substrate. A first metal film is formed in the recessed first conductive lines and pillars are formed from the first metal film. Some of the pillars are selectively removed and a second insulating layer is deposited around the remaining pillar. The remaining pillars are removed to form vias in the second insulating layer. A third insulating layer is deposited in the vias and an overburden is formed on the second insulating layer. Portions of the overburden are selectively etched from the second insulating layer to expose the second insulating layer and the filled vias and leaving portions of the third insulating layer on the second insulating layer. The third insulating layer is etched from the filled vias to form a via opening to the first conductive line.

14 Claims, 12 Drawing Sheets

(52) U.S. Cl.
CPC .. *H01L 21/76837* (2013.01); *H01L 21/76879* (2013.01); *H01L 21/76885* (2013.01); *H01L 21/32134* (2013.01)

(58) Field of Classification Search
CPC ........... H01L 21/6831; H01L 21/76811; H01L 21/76808; H01L 21/76885; H01L 21/76837; H01L 21/76879; H01L 2221/1026; H01L 21/76834; H01L 21/76883; H01L 21/32136; H01L 21/02244; H01L 21/32134; H01J 37/00
See application file for complete search history.

(56) References Cited

U.S. PATENT DOCUMENTS

| | | | |
|---|---|---|---|
| 6,130,151 A | 10/2000 | Lin et al. | |
| 6,143,653 A | 11/2000 | Tsai et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,721,888 B2 * | 8/2017 | Chang | H01L 23/485 |
| 9,837,314 B2 * | 12/2017 | Smith | H01L 21/76897 |
| 10,083,834 B2 | 9/2018 | Thompson et al. | |
| 10,319,604 B2 | 6/2019 | Duan et al. | |
| 10,319,636 B2 | 6/2019 | Basu et al. | |
| 2002/0098642 A1 | 7/2002 | Harris et al. | |
| 2002/0163081 A1 | 11/2002 | Aoyama | |
| 2003/0143862 A1 | 7/2003 | Iyer | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 * | 10/2015 | Shaviv | H01L 23/5226 257/774 |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0155664 A1 | 6/2016 | Chan et al. | |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0338149 A1 | 11/2017 | Lin | |
| 2018/0096847 A1 * | 4/2018 | Thompson | H01L 21/0338 |
| 2018/0130671 A1 | 5/2018 | Duan et al. | |
| 2018/0144980 A1 | 5/2018 | Basu et al. | |
| 2018/0358260 A1 * | 12/2018 | Roy | H01L 21/7682 |
| 2018/0374750 A1 | 12/2018 | Zhang et al. | |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/039011 dated Oct. 26, 2018, 9 pages.
PCT International Search Report and Written Opinion in PCT/US2018/048503 dated Dec. 14, 2018, 10 pages.

(56) References Cited

OTHER PUBLICATIONS

PCT International Search Report and Written Opinion in PCT/US2018/048504 dated Dec. 13, 2018, 10 pages.
PCT International Search Report and Written Opinion in PCT/US2018/048509 dated Dec. 13, 2018, 10 pages.
PCT ISR & Written Opinion for PCT/US2018/026026, dated Jul. 26, 2018, 11 pgs.

* cited by examiner

METHODS OF PRODUCING FULLY SELF-ALIGNED VIAS AND CONTACTS

CROSS-REFERENCE TO RELATED APPLICATIONS

This application claims priority to U.S. Provisional Application No. 62/524,527, filed Jun. 24, 2017, and U.S. Provisional Application No. 62/657,873, filed Apr. 15, 2018, the entire disclosures of which are hereby incorporated by reference herein.

TECHNICAL FIELD

Embodiments of the disclosure generally relate to methods of integrated circuit manufacturing requiring the connecting of multiple layers through a via. More particularly, embodiments of the disclosure are directed to methods of producing vias which are self-aligned such that conductive layers with lines running in opposing directions are connected.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the integrated circuit decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost. Therefore, a method of producing fully self-aligned vias is needed.

SUMMARY

One or more embodiments of the disclosure are directed to methods to provide a self-aligned via. First conductive lines are recessed on a first insulating layer on a substrate. The first conductive lines extend along a first direction on the first insulating layer. A first metal film is formed in the recessed first conductive lines. Pillars are formed from the first metal film in the recessed conductive lines. Some of the pillars are selectively removed, leaving at least one pillar. A second insulating layer is deposited around the remaining pillars. The remaining pillars are removed to form vias in the second insulating layer. A third insulating layer is deposited in the vias onto the recessed first conductive lines to form filled vias. An overburden of third insulating layer is formed on the second insulating layer. A portion of the overburden is selectively etched from the second insulating layer to expose the second insulating layer and the filled vias and leaving portions of third insulating layer on the second insulating layer. The third insulating layer is removed from the filled vias to form a via opening to the first conductive line.

Additional embodiments of the disclosure are directed to systems to manufacture an electronic device. The systems include a processing chamber, a plasma source and a processor. The processing chamber comprises a pedestal to hold a substrate comprising a plurality of first conductive lines on a first insulating layer. The first conductive lines extend along a first direction on the first insulating layer. The plasma source is coupled to the processing chamber to generate plasma. The processor is coupled to the plasma source. The processor has one or more configurations to control actions selected from: recessing the first conductive lines, forming a first metal film on the recessed first conductive lines, forming pillars from the first metal film in the recessed first conductive lines, selectively removing some of the pillars and leaving at least one pillar, depositing a second insulating layer around the remaining pillars, removing the remaining pillars to form vias in the second insulating layer, depositing a third insulating layer through the vias onto the recessed first conductive lines to form filled vias, forming an overburden of third insulating layer on the second insulating layer, selectively etching a portion of the overburden from the second insulating layer to expose the second insulating layer and the filled vias and leaving portions of third insulating layer on the second insulating layer, and/or etching the third insulating layer from the filled vias to form a via opening to the first conductive line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Methods and apparatuses to provide fully self-aligned vias are described. In one embodiment, a first metallization layer comprising a set of first conductive lines extending along a first direction on a first insulating layer on a substrate is formed. A second insulating layer is formed on the first insulating layer. A second metallization layer comprising a set of second conductive lines on a third insulating layer above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In one embodiment, the first and second directions cross each other at an angle. In one embodiment, the first direction and second direction are substantially orthogonal to each other.

In one embodiment, a fully self-aligned via is fabricated using a selective pillar growth technique. In one embodiment, the conductive lines on a first insulating layer on a substrate are recessed. The conductive lines extend along a first direction on the first insulating layer. Pillars are formed on the recessed conductive lines. A second insulating layer is deposited between the pillars. A third insulating layer is deposited on the second insulating layer. The third insulating layer is selectively etched relative to the second insulating layer form a via opening down to one of the conductive lines, as described in further detail below.

In one embodiment, a fully self-aligned via is the via that is self-aligned along at least two directions to the conductive lines in a lower and an upper metallization layers. In one embodiment, the fully self-aligned via is defined by a hard mask in one direction and the underlying insulating layer in another direction, as described in further detail below.

One or more embodiments provide fully self-aligned vias that advantageously eliminate the via misalignment issues and avoid shorting to the wrong metal line. The fully self-aligned vias provide lower via resistance and capacitance benefits over the conventional vias. Embodiments of the self-aligned vias provide full alignment between the vias and the conductive lines of the metallization layers that is substantially error free that advantageously increase the device yield and reduce the device cost.

Figure 22:
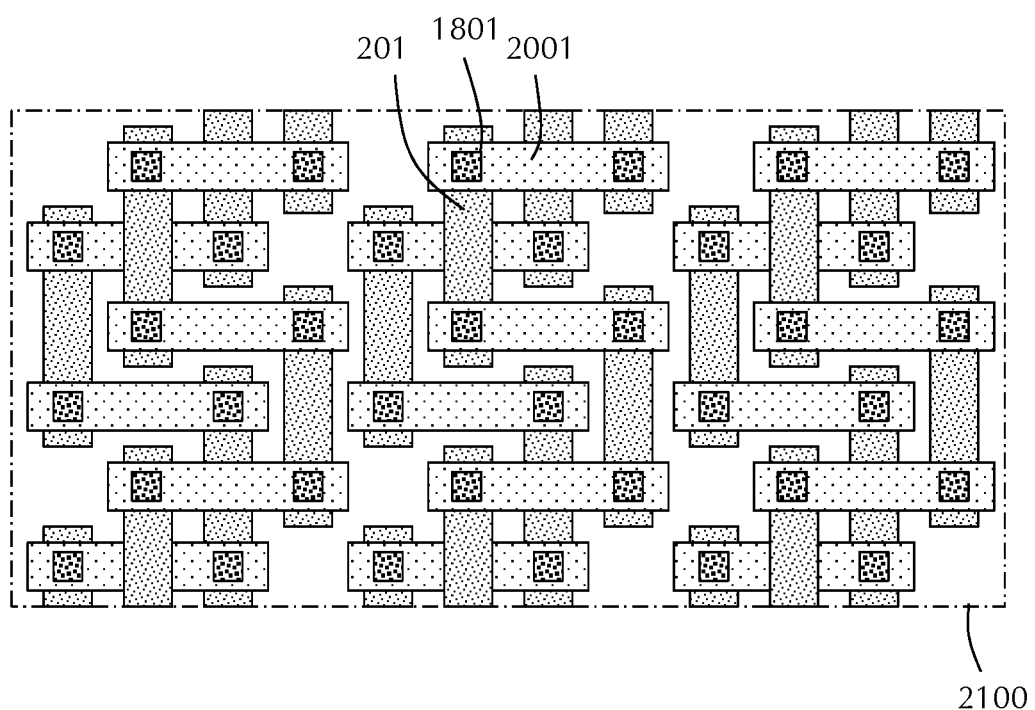
FIG. 22 shows a portion of an electronic device with fully self-aligned vias in accordance with one or more embodiment of the disclosure.

When vias are printed close together—closer than the minimum pitch that can be obtained by lithography—the via mask layer set are split into multiple masks. For example, instead of defining via to metal in a single litho-etch sequence, two or more litho-etch sequences are used to avoid shorting the closely spaced vias. Some embodiments of the disclosure are directed to pillar growth processes in which all vias are defined as the cross-over between two metal layers so that adjacent vias will not short to each other. In some embodiments, multiple vias can be defined using one large lithography feature placed over multiple cross points. In this case, all areas where the metal layers overlap under the defined large lithography opening will form a via. As discussed later, FIG. 22 shows the via 1801 linkages to the first conductive lines 201 and second conductive lines 2001 which cross each other. Cross-over portions that do not have a via 1801 can be maintained by the litho mask. Combining the self-aligned process with optimized via and routing design rules, the number of masks per layer can be reduced, saving costs and process complexity.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods and apparatus to provide fully self-aligned vias. The various aspects of the disclosure are described with respect to a detailed process illustrated in the Figures. Those skilled in the art will understand that the scope of the disclosure is not limited to the particular details described in the Figures and that some portions of the process can be altered or omitted.

Figure 1A:
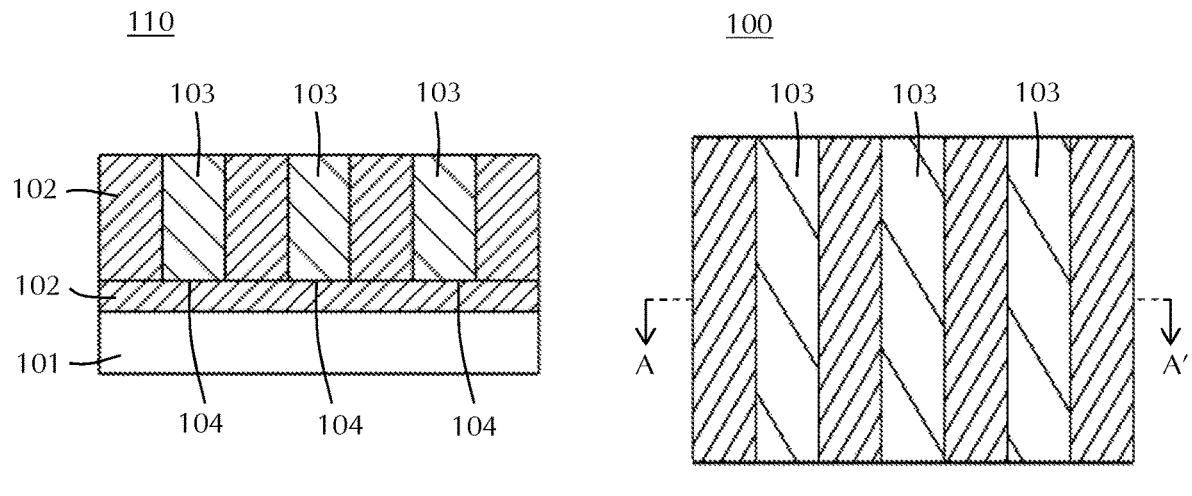
FIG. 1A illustrates a top view and a cross-sectional view of an electronic device structure to provide a fully self-aligned via according to some embodiments.
Figure 1B:
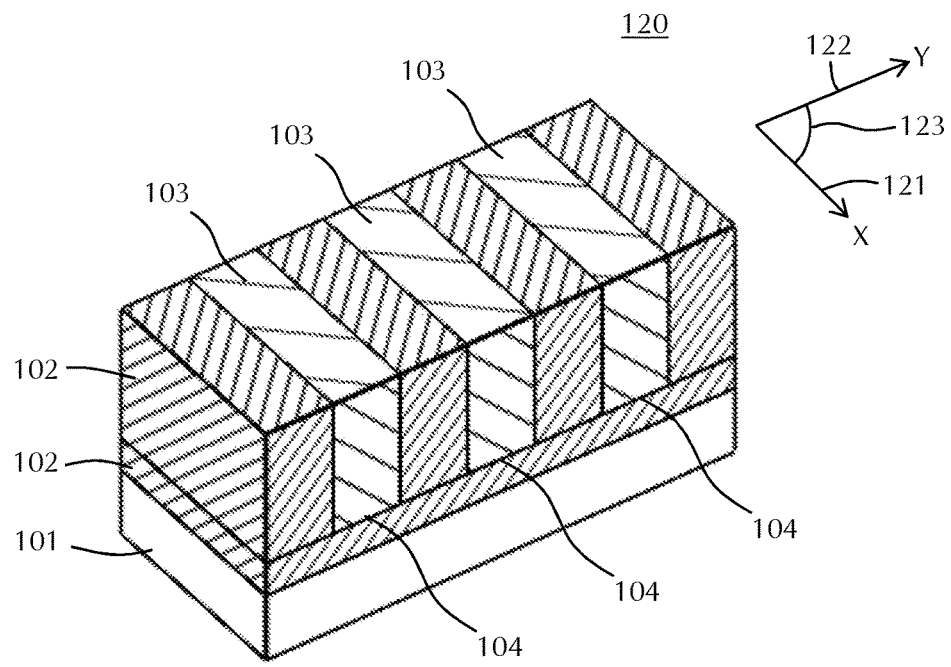
FIG. 1B is a perspective view of the electronic device structure depicted in FIG. 1A.

FIG. 1A illustrates a top view 100 and a cross-sectional view 110 of an electronic device structure to provide a fully self-aligned via or air gap according to some embodiments. The cross-sectional view 110 is along an axis A-A', as depicted in FIG. 1A. FIG. 1B is a perspective view 120 of the electronic device structure depicted in FIG. 1A. A lower metallization layer (Mx) comprises a set of conductive lines that extend along an X axis (direction) 121 on an insulating layer 102 on a substrate 101, as shown in FIGS. 1A and 1B. As shown in FIG. 1B, X direction 121 crosses a Y axis (direction) 122 at an angle 123. In one or more embodiments, angle 123 is about 90 degrees. In some embodiments, angle 123 is an angle that is other than a 90 degrees angle. The insulating layer 102 comprises trenches 104. The conductive lines 103 are deposited in trenches 104.

In some embodiments, the substrate 101 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 101 includes one or more metallization interconnect layers for integrated circuits. In some embodiments, the substrate 101 includes interconnects, for example, vias, configured to connect the metallization layers. In some embodiments, the substrate 101 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In some embodiments, electrically insulating layer 102 is an oxide layer, e.g., silicon dioxide, or any other electrically insulating layer determined by an electronic device design. In some embodiments, insulating layer 102 comprises an interlayer dielectric (ILD). In some embodiments, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof.

In some embodiments, insulating layer 102 includes a dielectric material having k value less than 5. In some embodiments, insulating layer 102 includes a dielectric material having k-value less than 2. In some embodiments, insulating layer 102 includes a nitride, oxide, a polymer, phosphosilicate glass, Fluorosilicate (SiOF) glass, organosilicate glass (SiOCH), other electrically insulating layer determined by an electronic device design, or any combination thereof. In some embodiments, insulating layer 102 may include polyimide, epoxy, photodefinable materials, such as benzocyclobutene (BCB), and WPR-series materials, or spin-on-glass.

In some embodiments, insulating layer 102 is a low-k interlayer dielectric to isolate one metal line from other metal lines on substrate 101. In some embodiments, the thickness of the layer 102 is in an approximate range from about 10 nanometers (nm) to about 2 microns (μm).

In some embodiments, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALO"), spin~on, or other insulating deposition techniques known to one of ordinary skill in the art of microelectronic device manufacturing.

In some embodiments, the lower metallization layer Mx comprising metal lines 103 is a part of a back end metallization of the electronic device. In some embodiments, the insulating layer 102 is patterned and etched using a hard mask to form trenches 104 using one or more patterning and etching techniques known to one of ordinary skill in the art of microelectronic device manufacturing. In some embodiments, the size of trenches in the insulating layer 102 is determined by the size of conductive lines formed later on in a process.

In some embodiments, forming the conductive lines 103 involves filling the trenches 104 with a layer of conductive material. In some embodiments, a base layer (not shown) is first deposited on the internal sidewalls and bottom of the trenches 104, and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 102. Additionally, the conductive barrier layer can be used to provide adhesion for the seed layer (e.g., copper).

In some embodiments, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer e.g., copper, is deposited onto the seed layer of base layer of copper, by an electroplating process. In some embodiments, the conductive layer is deposited into the trenches 104 using a damascene process known to one of ordinary skill in the art of microelectronic device manufacturing. In one embodiment, the conductive layer is deposited onto the seed layer in the trenches 104 using a selective deposition technique, such as but not limited to electroplating, electroless, a CVD, PVD, MBE, MOCVD, ALO, spin-on, or other deposition techniques known to one of ordinary skill in the art of microelectronic device manufacturing.

In some embodiments, the choice of a material for conductive layer for the conductive lines 103 determined the choice of a material for the seed layer. For example, if the material for the conductive lines 103 includes copper, the material for the seed layer also includes copper. In some embodiments, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hi), tantalum (Ta), tungsten (W), Vanadium (V), Molybdenum (Mo), palladium (Pd), gold (Au), silver (Au), platinum Pl, indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 103 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 5 nm to about 50 nm.

In some embodiments, the lower metallization layer Mx is configured to connect to other metallization layers (not shown). In some embodiments, the metallization layer Mx is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 2A:
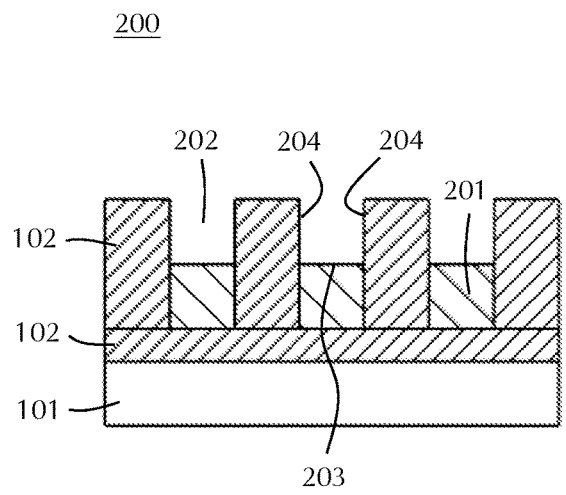
FIG. 2A is a side cross-sectional view of the electronic device structure after the conductive lines are recessed according to some embodiments.
Figure 2B:
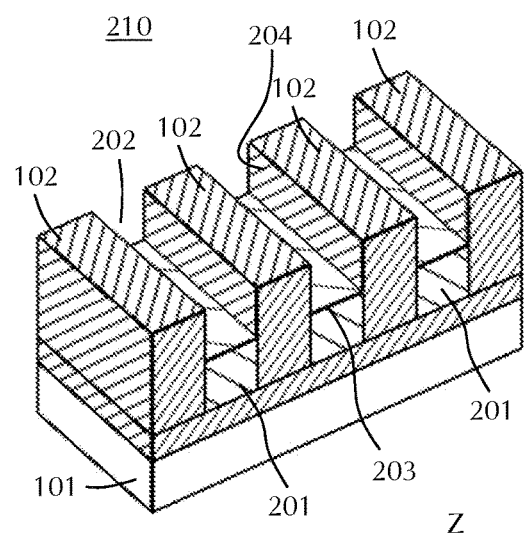
FIG. 2B is a top view of the electronic device structure of FIG. 2A.

FIG. 2A is a view 200 similar to view 110 of FIG. 1A, after the conductive lines 103 are recessed according to some embodiments. FIG. 2B is a view 210 similar to FIG. 1B, after the conductive lines 103 are recessed according to some embodiments. The conductive lines 103 are recessed to a predetermined depth to form recessed conductive lines 201. As shown in FIGS. 2A and 2B, trenches 202 are formed in the insulating layer 102. Each trench 202 has sidewalls 204 that are portions of insulating layer 102 and a bottom that is a top surface 203 of the recessed conductive line 201.

In some embodiments, the depth of the trenches 202 is from about 10 nm to about 500 nm. In some embodiments, the depth of the trenches 202 is from about 10% to about 100% of the thicknesses of the conductive lines. In some embodiments, the conductive lines 103 are recessed using one or more of wet etching, dry etching, or a combination of techniques known to one of ordinary skill in the art of electronic device manufacturing.

Figure 3:
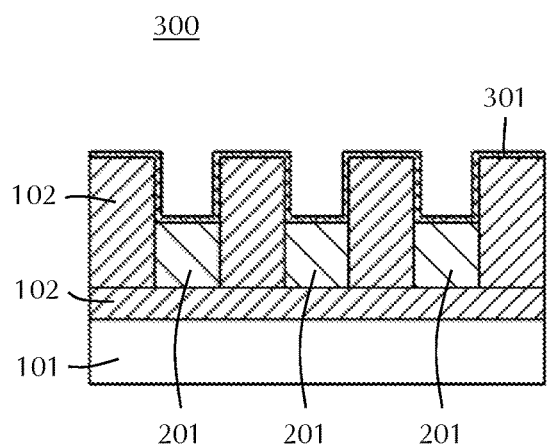
FIG. 3 is a side cross-sectional view of the electronic device structure after a liner is deposited on the recessed conductive lines according to some embodiments.

FIG. 3 is a view 300 similar to FIG. 2A, after a liner 301 is deposited on the recessed conductive lines 201 according to some embodiments. Liner 301 is deposited on the bottom and sidewalls of the trenches 202, as shown in FIG. 3.

In some embodiments, liner 301 is deposited to protect the conductive lines 201 from changing the properties later on in a process (e.g., during tungsten deposition, or other processes). In some embodiments, liner 301 is a conductive liner. In another embodiment, liner 301 is a non-conductive liner. In some embodiments, when liner 301 is a non-conductive liner, the liner 301 is removed later on in a process, as described in further detail below. In some embodiments, liner 301 includes titanium nitride (TiN), titanium (Ti), tantalum (Ta), tantalum nitride (TaN), or any combination thereof. In another embodiment, liner 301 is an oxide, e.g., aluminum oxide (AlO), titanium oxide ($TiO_2$). In yet another embodiment, liner 301 is a nitride, e.g., silicon nitride (SiN). In an embodiment, the liner 301 is deposited to the thickness from about 0.5 nm to about 10 nm.

In some embodiments, the liner 301 is deposited using an atomic layer deposition (ALD) technique. In some embodiments, the liner 301 is deposited using one of deposition techniques, such as but not limited to a CVD, PVD, MBE, MOCVD, spin-on, or other liner deposition techniques known to one of ordinary skill in the art of microelectronic device manufacturing.

Figure 4:
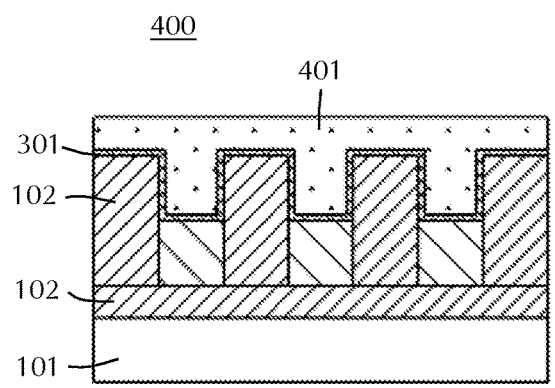
FIG. 4 is a side cross-sectional view of the electronic device structure after a seed gapfill layer is deposited on the liner according to some embodiments.

FIG. 4 is a view 400 similar to FIG. 3, after a seed gapfill layer 401 is deposited on the liner 301 according to some embodiments. In some embodiments, seed gapfill layer 401 is a self-aligned selective growth seed film. As shown in FIG. 4, seed gapfill layer 401 is deposited on liner 301 on the top surface 203 of the recessed conductive lines 201, the sidewalls 204 of the trenches 202 and top portions of the insulating layer 102. In some embodiments, seed gapfill layer 401 is a tungsten (W) layer, or other seed gapfill layer to provide selective growth pillars. In some embodiments, seed gapfill layer 401 is a metal film or a metal containing film. Suitable metal films include, but are not limited to, films including one or more of Co, Mo, W, Ta, Ti, Ru, rhodium (Rh), Cu, Fe, Mn, V, Niobium (Nb), hafnium (Hf), Zirconium (Zr), Yttrium (Y), Al, Sn, Cr, Lanthanum (La), or any combination thereof. In some embodiments, seed gapfill layer 401 comprises is a tungsten (W) seed gapfill layer.

In some embodiments, the seed gapfill layer 401 is deposited using one of deposition techniques, such as but not limited to an ALD, a CVD, PVD, MBE, MOCVD, spin-on, or other liner deposition techniques known to one of ordinary skill in the art of microelectronic device manufacturing.

Figure 5A:
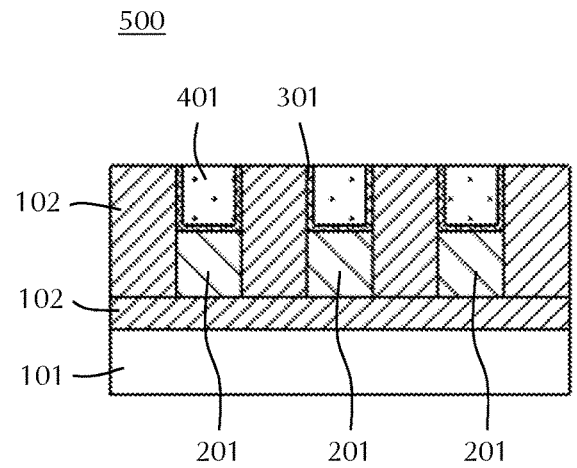
FIG. 5A is a side cross-sectional view of the electronic device structure after portions of the seed gapfill layer are removed to expose top portions of the insulating layer according to some embodiments.
Figure 5B:
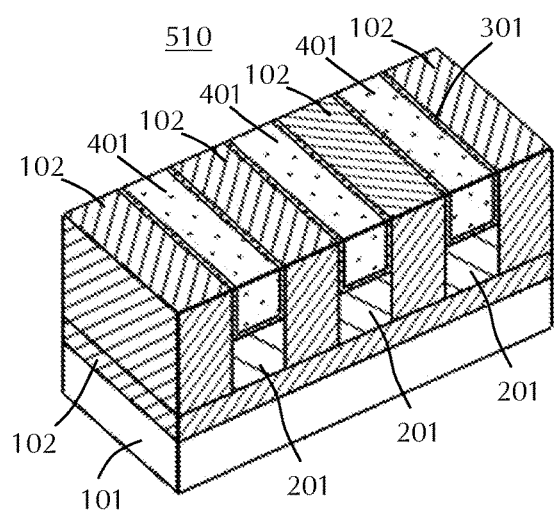
FIG. 5B is a perspective view of the electronic device structure shown in FIG. 5A.

FIG. 5A is a view 500 similar to FIG. 4, after portions of the seed gapfill layer 401 are removed to expose top portions of the insulating layer 102 according to one embodiment. FIG. 5B is a perspective view of the electronic device structure shown in FIG. 5A. In some embodiments, the portions of the seed gapfill layer 401 are removed using one of the chemical-mechanical polishing (CMP) techniques known to one of ordinary skill in the art of microelectronic device manufacturing.

Figure 6A:
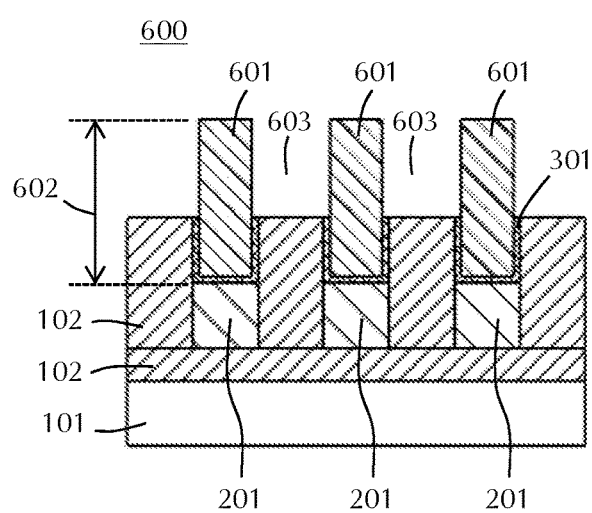
FIG. 6A is a side cross-sectional view of the electronic device structure after self-aligned selective growth pillars are formed according to some embodiments.
Figure 6B:
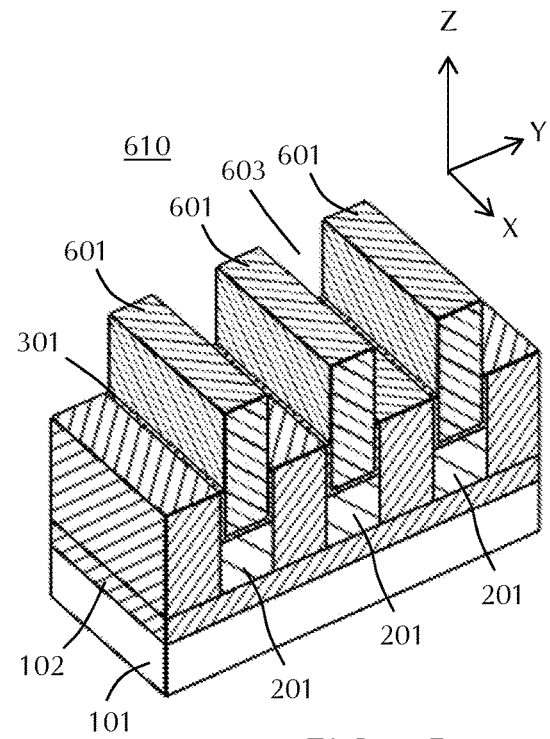
FIG. 6B is a perspective view of the electronic device structure shown in FIG. 6A.

FIG. 6A is a view 600 similar to FIG. 5A, and FIG. 6B is a view 610 similar to FIG. 5B, after self-aligned selective growth pillars 601 are formed using the seed gap fill layer 401 on the liner 301 on the recessed conductive lines 201 according to one or more embodiment. As shown in FIGS. 6A and 6B, an array of the self-aligned selective growth pillars 601 has the same pattern as the set of the conductive lines 201. As shown in FIGS. 6A and 6B, the pillars 601 extend substantially orthogonally from the top surfaces of the conductive lines 201. As shown in FIGS. 6A and 6B, the pillars 601 extend along the same direction as the conductive lines 201. As shown in FIGS. 6A and 6B, the pillars 601 are separated by gaps 603.

In some embodiments, the pillars 601 are selectively grown from the seed gapfill layer 401 on portions of the liner 301 on the conductive lines 201. The pillars 601 are not grown on portions of the liner 301 on the insulating layer 102, as shown in FIGS. 6A and 6B. In some embodiments, portions of the seed gapfill layer 401 above the conductive lines 201 are expanded for example, by oxidation, nitridation, or other process to grow pillars 601. In some embodiments, the seed gapfill layer 401 is oxidized by exposure to an oxidizing agent or oxidizing conditions to transform the metal or metal containing seed gapfill layer 401 to metal oxide pillars 601. In some embodiments, pillars 601 include an oxide of one or more metals listed above. In more specific embodiment, pillars 601 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In some embodiments, the pillars 601 are formed by oxidation of the seed gapfill layer at any suitable temperature depending on, for example, the composition of the seed gapfill layer and the oxidizing agent. In some embodiments, the oxidation occurs at a temperature in an approximate range of about 25 degrees C. to about 800 degrees C. In some embodiments, the oxidation occurs at a temperature greater than or equal to about 150° C. In some embodiments, the height 602 of the pillars 601 is in an approximate range from about 5 angstroms (A.) to about 10 microns (µm).

Figure 7A:
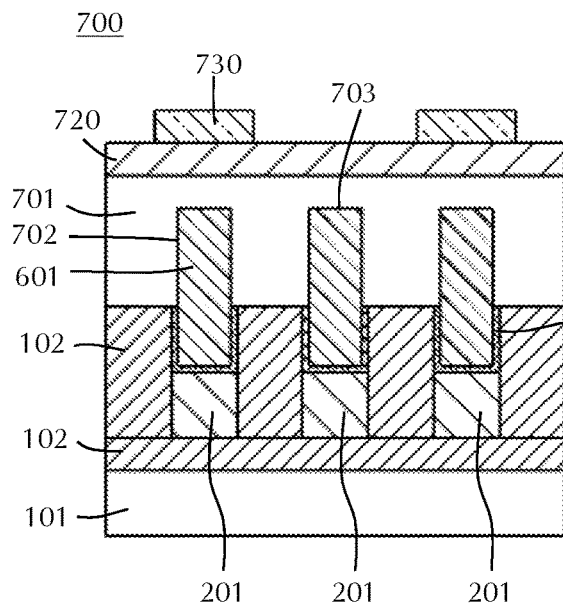
FIG. 7A is a side cross-sectional view of the electronic device structure after an insulating layer and mask are formed according to some embodiments.
Figure 7B:
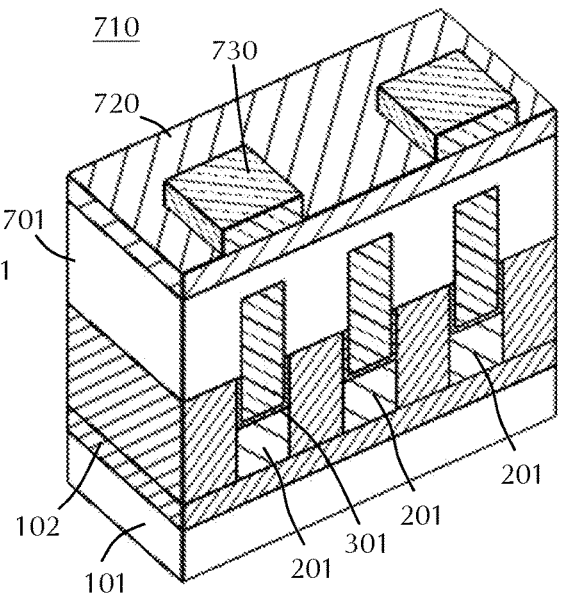
FIG. 7B is a perspective view of the electronic device structure shown in FIG. 7A.
Figure 7B:
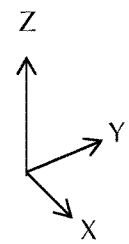

FIG. 7A is a view 700 similar to FIG. 6A, and FIG. 7B is a view 710 similar to FIG. 6B, after an insulating layer 701 is deposited to overfill the gaps between the pillars 601 according to some embodiments. As shown in FIGS. 7A and 7B, insulating layer 701 is deposited on the opposing sides 702 and top portions 703 of the pillars 601 and through the gaps on the portions of the insulating layer 102 and liner 301 between the pillars 601. A first mask 720 and a second mask 730 are illustrated on the insulating layer 701. The first mask 720 is shown covering the all of the insulating layer 701 and the second mask 730 is isolated over separate pillars 601. Those skilled in the art will recognize that the masking and insulator layers can be single or multiple layers.

In some embodiments, insulating layer 701 is a low-k gapfill layer. In one embodiment, insulating layer 701 is a flowable silicon oxide (FSiOx) layer. In some embodiments, insulating layer 701 is an oxide layer, e.g., silicon dioxide, or any other electrically insulating layer determined by an electronic device design. In some embodiments, insulating layer 701 is an interlayer dielectric (ILD). In some embodiments, insulating layer 701 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, insulating layer 701 is a dielectric material having k-value less than 3. In some embodiments, insulating layer 701 is a dielectric material having k-value in an approximate range from about 2.2 to about 2.7. In some embodiments, insulating layer 701 includes a dielectric material having k-value less than 2. In some embodiments, insulating layer 701 represents one of the insulating layers described above with respect to insulating layer 102.

In some embodiments, insulating layer 701 is a low-k interlayer dielectric to isolate one metal line from other metal lines. In some embodiments, insulating layer 701 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Mask 720 and/or mask 730 can be any suitable material. In some embodiments, one or more of mask 720 or mask 730 comprise silicon nitride, silicon oxide, silicon oxynitride, silicon carbide, silicon oxycarbide, silicon carbonitride or silicon oxycarbonitride. In some embodiments, one or more of the mask 720 or the mask 730 comprises a photoresist.

Figure 8A:
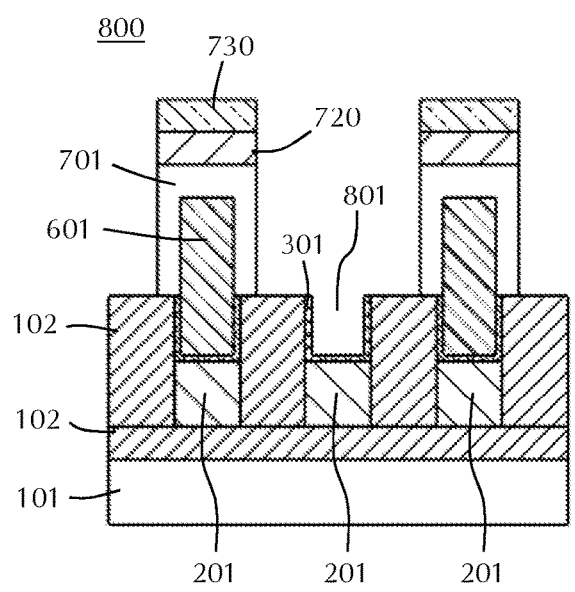
FIG. 8A is a side cross-sectional view of the electronic device structure after etching the insulating layer according to some embodiments.
Figure 8B:
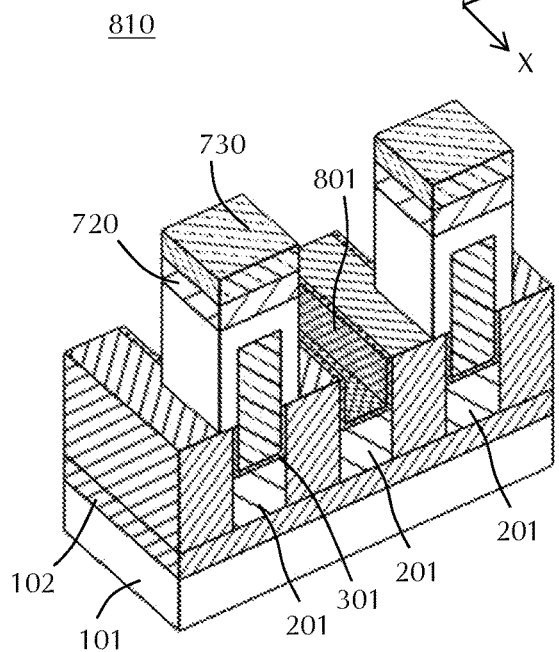
FIG. 8B is a perspective view of the electronic device structure shown in FIG. 8A.

FIG. 8A is a view 800 similar to FIG. 7A, and FIG. 8B is a view 810 similar to FIG. 7B, after etching portions of the mask 720, insulating layer 701 and at least one pillar 601.

The etch leaves at least one pillar 601 in contact with conductive lines 201. In the embodiment illustrated, there are two pillars 601 remaining in contact with the conductive lines 201 and one pillar has been removed.

In the embodiment illustrated, the etch process isotropically removes material that is not directly below mask 730. Portions of the insulating layer 701 remain on the sides 702 and top 703 of the remaining pillars 601. The middle pillar 601, or any pillar not shielded by the mask 730, is removed leaving a gap 801.

In the embodiment illustrated the liner 301 remains in the gap 801. In some embodiments, the liner 301 is selectively removed using one or more of the dry and wet etching techniques known to one of ordinary skill in the art of electronic device manufacturing.

Etching can be performed in this part of the process, or any other part of the process incorporating an etch, by any suitable etch technique known to those skilled in the art. In some embodiments, the etch process is one or more of a dry etch or wet etch. In some embodiments, the etch solution comprises 5 wt % ammonium hydroxide aqueous solution at a temperature of about 80° C. In some embodiments, hydrogen peroxide is added to the ammonium hydroxide solution to increase the etch rate. In some embodiments, a hydrofluoric acid and nitric acid in a ratio of about 1:1 is used to etch. In some embodiments, the HF and $HNO_3$ in a ratio of about 3:7, respectively, is used to etch. In some embodiments, the $HF:HNO_3$ ratio is about 4:1. In some embodiments, the pillars 601 include tungsten and/or titanium and are etched using ammonium hydroxide:hydrogen peroxide in a ratio of 1:2. In one embodiment, the pillars 601 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 601 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 601 are selectively wet etched using HF, $HNO_3$ and acetic acid (HAc) in a ratio of 4:4:3, respectively. In one embodiment, the pillars 601 are selectively dry etched using a bromotrifluoromethane ($CBrF_3$) reactive ion etching (RIE) technique. In one embodiment the pillar 601 am selectively dry etched using a chlorine, fluorine, bromine or any combination thereof based chemistries. In one embodiment, the pillars 601 are selectively wet etched using hot or warm Aqua Regia mixture including HCl and $HNO_3$ in a ratio of 3:1, respectively. In one embodiment, the pillars 601 arc selectively etched using alkali with oxidizers (potassium nitrate ($KNO_3$) and lead dioxide ($PbO_2$)).

Figure 9A:
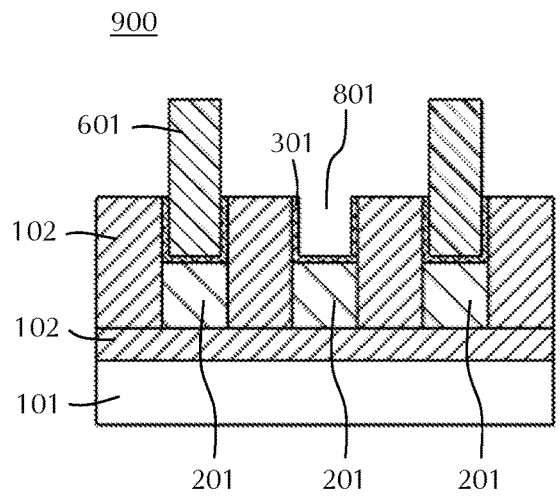
FIG. 9A is a side cross-sectional view of the electronic device structure after removing the remaining insulating layer according to some embodiments.
Figure 9B:
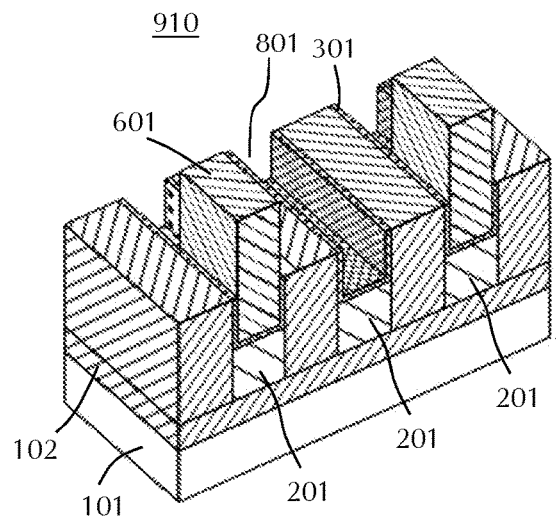
FIG. 9B is a perspective view of the electronic device structure shown in FIG. 9A.

FIG. 9A is a view 900 and FIG. 9B is a view 910 that are similar to FIGS. 8A and 8B, respectively, after removal of the insulating layer 701, mask 720 and mask 730 to expose the pillars 601 and gap 801. The insulating layer 701, mask 720 and mask 730 can be removed by any suitable technique or combination of techniques. For example an etch process could selectively remove the insulating layer 701, mask 720 and mask 730 without affecting pillar 601 or insulating layer 102. In some embodiments, more than one etch process is used to remove the insulating layer 701, mask 720 and mask 730. For example, a first etch process can be used to remove mask 730 and a second etch process can be used to remove mask 720 and insulating layer 701. In some embodiments, there are three etch processes used to remove the three layers with each etch process selective for one of the layers.

Figure 10A:
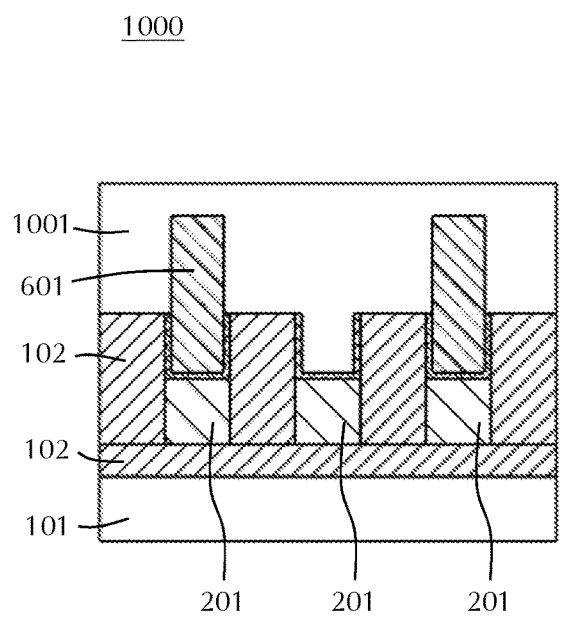
FIG. 10A is a side cross-sectional view of the electronic device structure after forming a second insulating layer according to some embodiments.
Figure 10B:
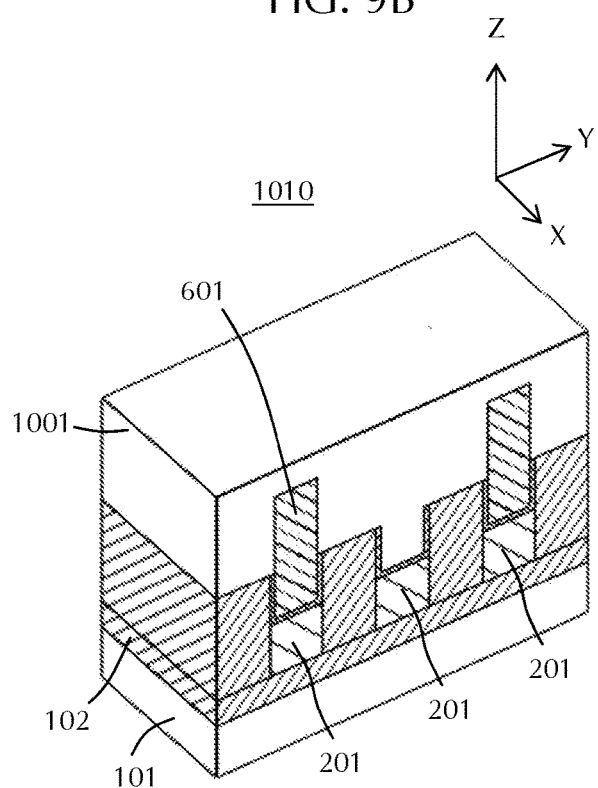
FIG. 10B is a perspective view of the electronic device structure shown in FIG. 10A.

FIG. 10A is a view 1000 and FIG. 10B is a view 1010 that are similar to FIGS. 9A and 9B, respectively, after deposition of a second insulating layer 1001, also referred to as interlayer dielectric or ILD-A. The second insulating layer 1001 can be any suitable dielectric material as described above with regard to insulating layer 102. In some embodiments, ILD-A comprises a flowable film. In some embodiments, the flowable film comprises one or more of silicon oxide or silicon oxycarbide. In some embodiments, the ILD-A comprises a spin-on low-k material.

In the embodiment shown in FIGS. 10A and 10B, the second insulating layer 1001 has a height greater than pillars 601. Stated differently, the thickness of the second insulating layer 1001 is sufficient to cover the pillars 601. In some embodiments, the second insulating layer 1001 is formed so that a top of the ILD-A is substantially even with the pillars 601 or slightly below the top of pillars 601.

Figure 11A:
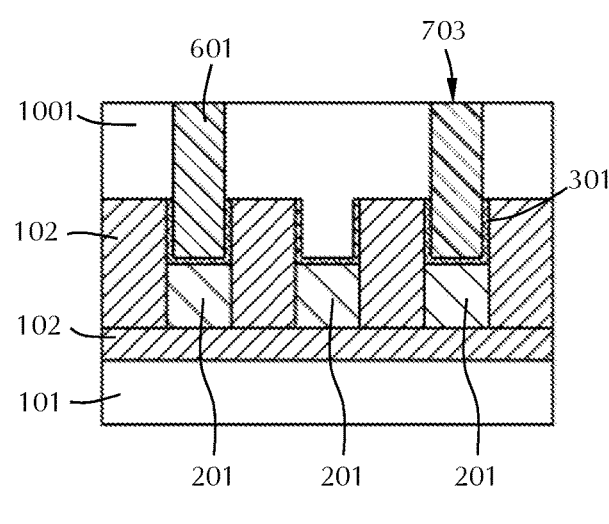
FIG. 11A is a side cross-sectional view of the electronic device structure after planarizing the second insulating layer according to some embodiments.
Figure 11B:
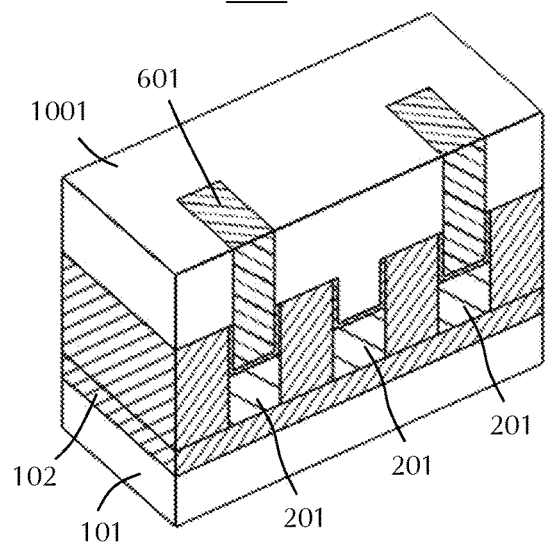
FIG. 11B is a perspective view of the electronic device structure shown in FIG. 11A.

FIG. 11A is a view 1100 and FIG. 11B is a view 1110 that are similar to FIGS. 10A and 10B, respectively, after chemical-mechanical planarization (CMP) of the second insulating layer 1001 to expose the tops 703 of the pillars 601. The CMP process can be any suitable planarization process known to those skilled in the art. In some embodiments, the second insulating layer 1001 is deposited so that the top of the ILD-A is even with or slightly below the top 703 of the pillars 601 and the CMP process is not performed.

Figure 12A:
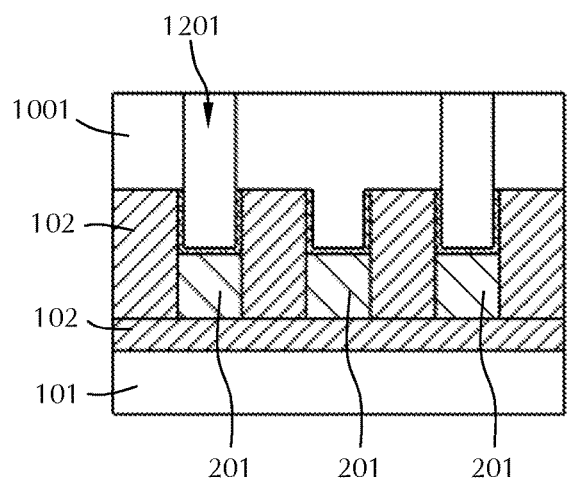
FIG. 12A is a side cross-sectional view of the electronic device structure after removing the pillars according to some embodiments.
Figure 12B:
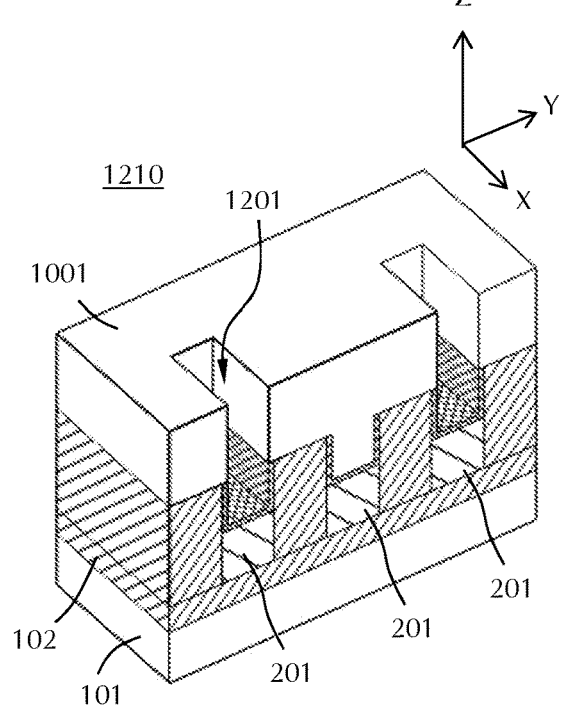
FIG. 12B is a perspective view of the electronic device structure shown in FIG. 12A.

FIG. 12A is a view 1200 and FIG. 12B is a view 1210 that are similar to FIGS. 11A and 11B, respectively, after removal of the pillars 601 to leave vias 1201 in the second insulating layer 1001. Etching of the pillars 601 can be done by any suitable technique. In some embodiments, etching the pillars 601 comprises exposing the pillars 601 to a metal halide compound. In some embodiments, the metal halide compound has a different metal than the pillars 601.

In some embodiments, etching the pillars 601 comprises exposure to a metal-and-halogen-containing precursor (e.g. $WCl_6$), also referred to as a metal halide precursor. The metal halide precursor can react with the pillars 601. In some embodiments, exposure to the metal halide precursor causes an exothermic reaction with the pillar material and no plasma is present in the substrate processing region. In some embodiments, there is no plasma used to excite the metal-halide precursor prior to entering the substrate processing region.

In an exemplary non-limiting process, the pillars 601 comprise tungsten and are grown by reaction with oxygen to form the tungsten oxide pillars, which may take the form of $WO_3$. Exposure of $WO_3$ to $WCl_6$ (or possibly $WCl_5$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

Figure 13A:
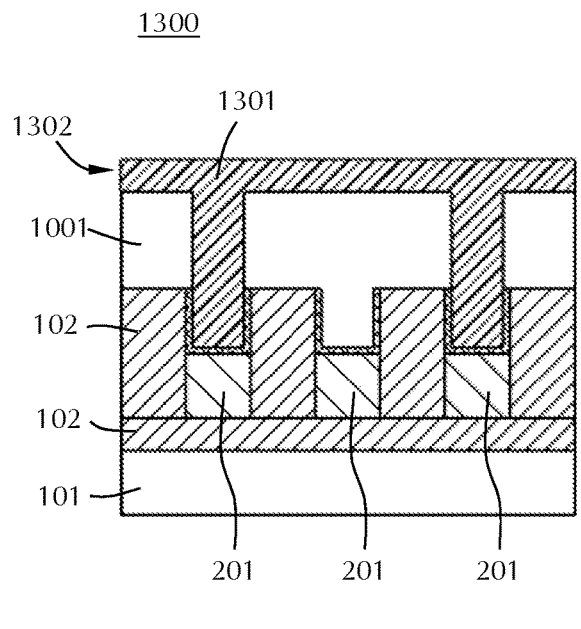
FIG. 13A is a side cross-sectional view of the electronic device structure after depositing a third insulating layer according to some embodiments.
Figure 13B:
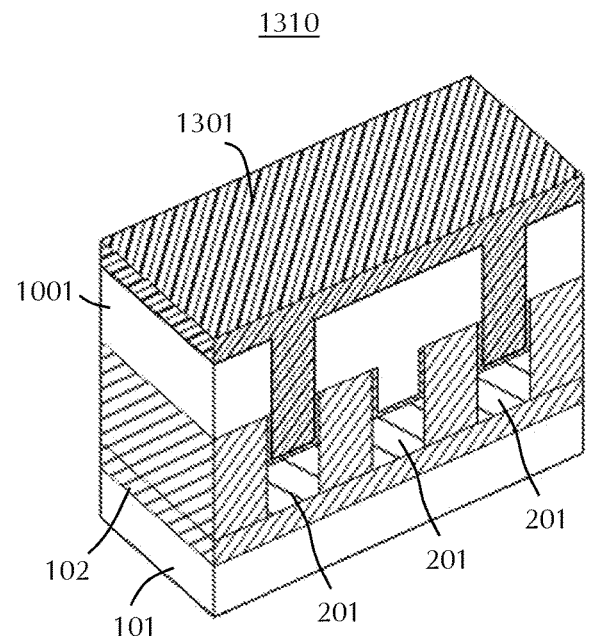
FIG. 13B is a perspective view of the electronic device structure shown in FIG. 13A.

FIG. 13A is a view 1300 and FIG. 13B is a view 1310 that are similar to FIGS. 12A and 12B, respectively, after gap-filling the vias 1201 with a third insulating layer 1301. The third insulating layer 1301 can be any suitable dielectric material that is different than the second insulating layer 1001. The third insulating layer 1301 fills the vias 1201 and contacts the liner 301 (as shown) or the recessed first conductive lines 201 (if no liner 301 is present).

In the embodiment illustrated, the third insulating layer 1301 is deposited with a thickness sufficient to form an overburden 1302 on top of the second insulating layer 1001. The overburden 1302 can be any suitable thickness that is readily removable in a subsequent planarization or etch process. The third insulating layer 1301 can also be referred to as a second interlayer dielectric or ILD-B. The third insulating layer 1301 of some embodiments comprises a low-k dielectric having a dielectric constant less than or equal to about 5. In some embodiments, one or more of the first insulating layer, the second insulating layer and the third insulating layer are independently selected from: oxides, carbon doped oxides, porous silicon dioxide, nitrides, polymers, phosphosilicate glass, fluorosilicate (SiOF) glass, organosilicate glass (SiOCH), or any combinations thereof.

Figure 14A:
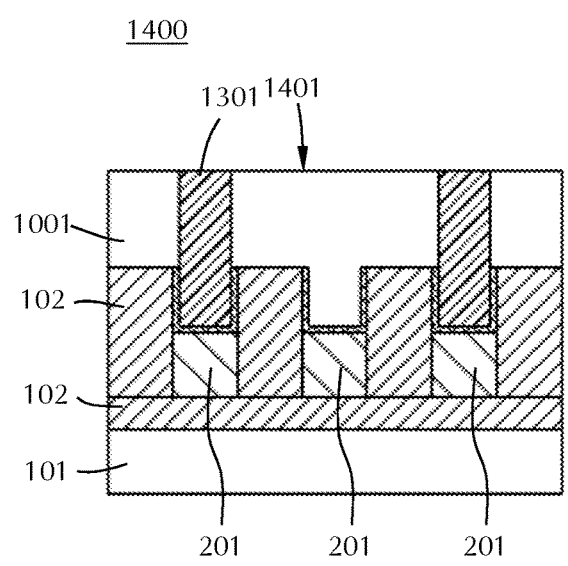
FIG. 14A is a side cross-sectional view of the electronic device structure after removing an overburden of the third insulating layer according to some embodiments.
Figure 14B:
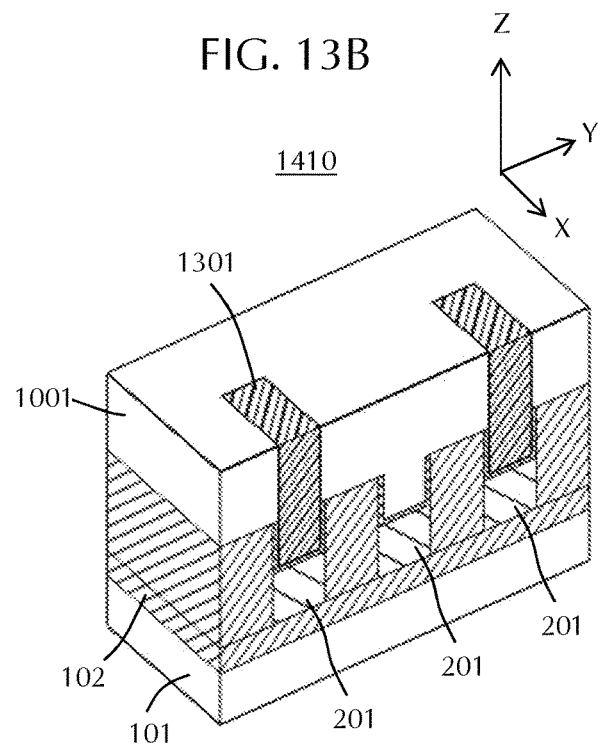
FIG. 14B is a perspective view of the electronic device structure shown in FIG. 14A.

FIG. 14A is a view 1400 and FIG. 14B is a view 1410 that are similar to FIGS. 13A and 13B, respectively, after removal of the overburden 1302 of the third insulating layer 1301. In some embodiments, the overburden 1302 can be removed by a chemical-mechanical planarization (CMP) process known to those skilled in the art.

In some embodiments, the overburden 1302 is removed by a selective etch process. The selective etch process can be selective for removal of the third insulating layer 1301 relative to the second insulating layer 1001 so that substantially none of the second insulating layer 1001 is removed. After removal of the overburden 1302, the second insulating layer 1001 and the third insulating layer 1301 are exposed. Stated differently, after removal of the overburden 1302 both the first interlayer dielectric ILD-A and the second interlayer dielectric ILD-B are exposed.

Figure 15A:
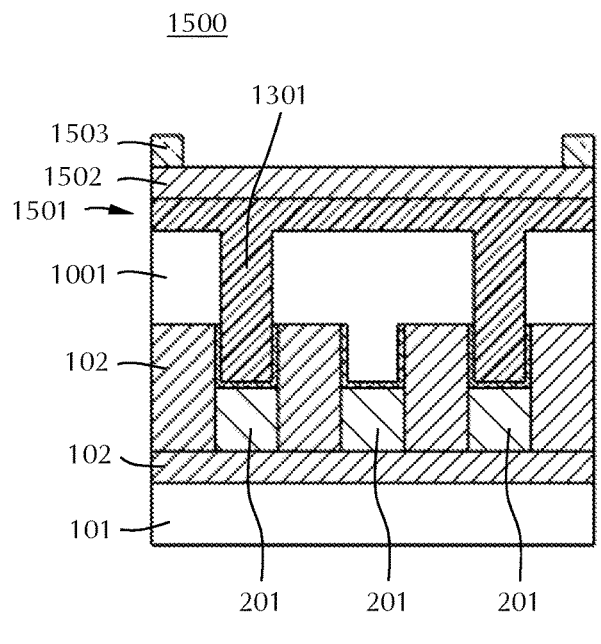
FIG. 15A is a side cross-sectional view of the electronic device structure after forming a known thickness of additional third insulating layer and masking according to some embodiments.
Figure 15B:
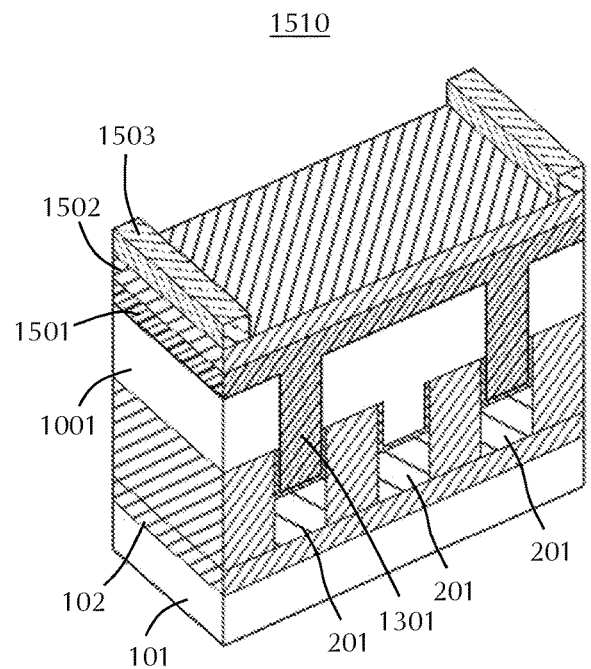
FIG. 15B is a perspective view of the electronic device structure shown in FIG. 15A.

FIG. 15A is a view 1500 and FIG. 15B is a view 1510 that are similar to FIGS. 14A and 14B, respectively, after formation of additional third insulating layer 1501, stack 1502 and mask 1503. The additional third insulating layer 1501 is the same material as the third insulating layer 1301 already present in the vias. The combination of the thickness of the additional third insulating layer 1501 and the stack 1502 is substantially the same as the depth of the via. The third insulating layer 1301, additional third insulating layer 1501, stack 1502 and mask 1503 can be formed by any suitable technique known to those skilled in the art.

Figure 16A:
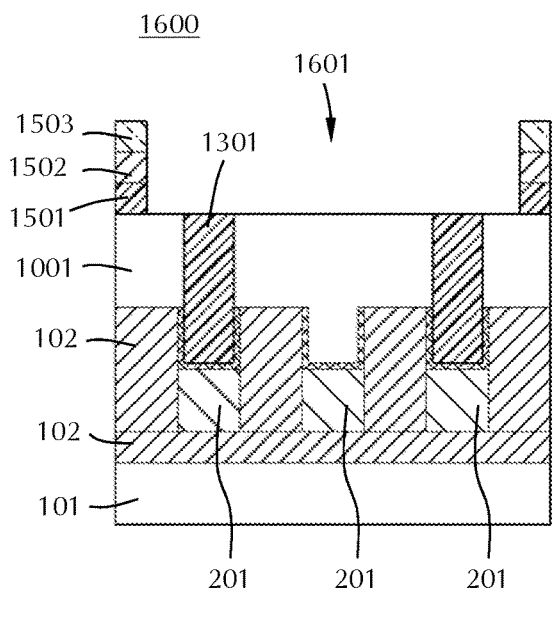
FIG. 16A is a side cross-sectional view of the electronic device structure after etching the additional third insulating layer to a known depth according to some embodiments.
Figure 16B:
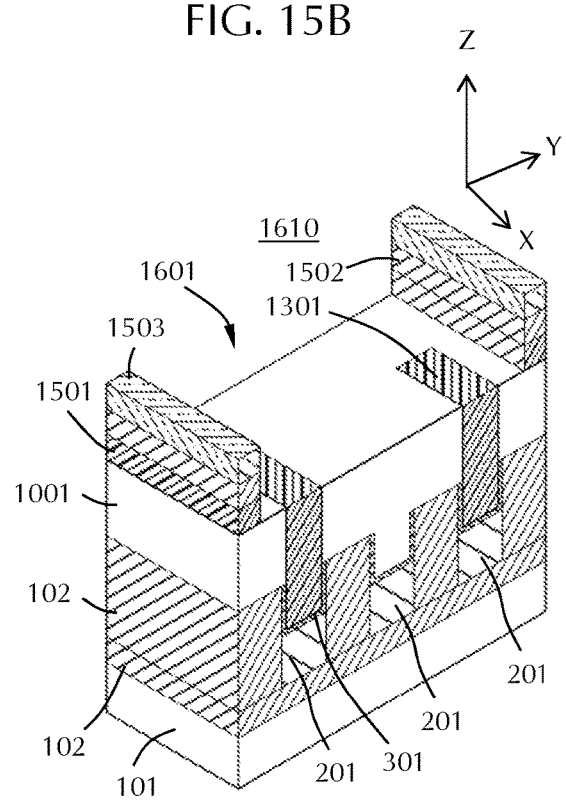
FIG. 16B is a perspective view of the electronic device structure shown in FIG. 16A.

FIG. 16A is a view 1600 and FIG. 16B is a view 1610 that are similar to FIGS. 15A and 15B, respectively, after etching the stack 1502 and additional third insulating layer 1501 to expose the second insulating layer 1001. The mask 1503 covers portions of the stack 1502 and additional third insulating layer 1501 that are not removed during the etch process to form trench 1601.

Trench 1601 extends in a second direction that is different from the first direction of the first conductive lines 201. In the embodiment shown, the first conductive lines 201 extend along the x-axis and the trench 1601 extends along the y-axis. In some embodiments, the second direction is at an angle to the first direction in the range of about 30° to about 150°, or in the range of about 50° to about 130°, or in the range of about 70° to about 110°, or in the range of about 80° to about 100°, or in the range of about 85° to about 95°, or in the range of about 87° to about 93°, or in the range of about 89° to about 91°.

Figure 17A:
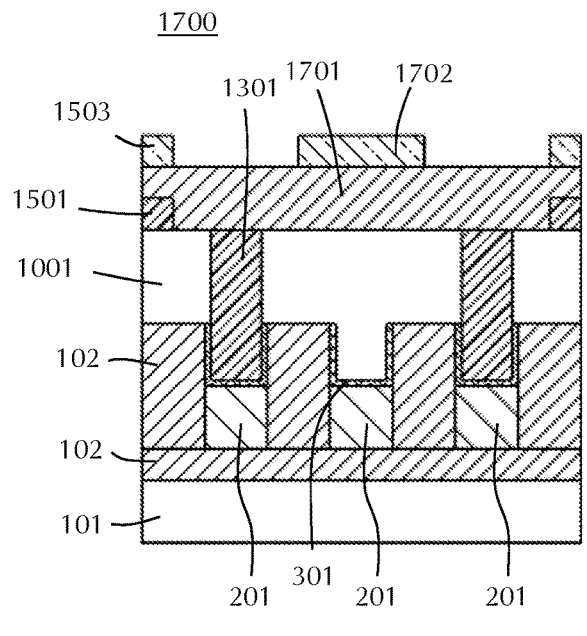
FIG. 17A is a side cross-sectional view of the electronic device structure after forming a stack and masking according to some embodiments.
Figure 17B:
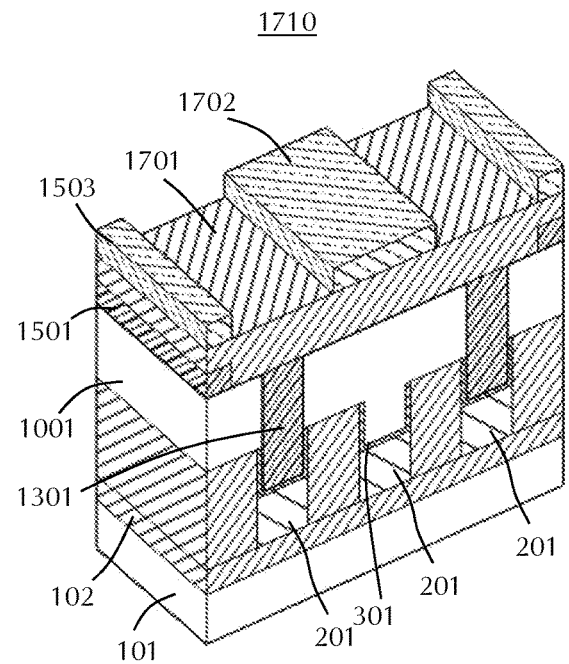
FIG. 17B is a perspective view of the electronic device structure shown in FIG. 17A.

FIG. 17A is a view 1700 and FIG. 17B is a view 1710 that are similar to FIGS. 16A and 16B, respectively, after additional stack 1701 (e.g., a trilayer stack known to the skilled artisan) and mask 1702 is formed. The stack 1701 and mask 1702 can be any suitable materials. In some embodiments, the additional stack 1701 has a thickness that is substantially equal to the thickness of the additional third insulating layer 1501 and stack 1502 already present.

Figure 18A:
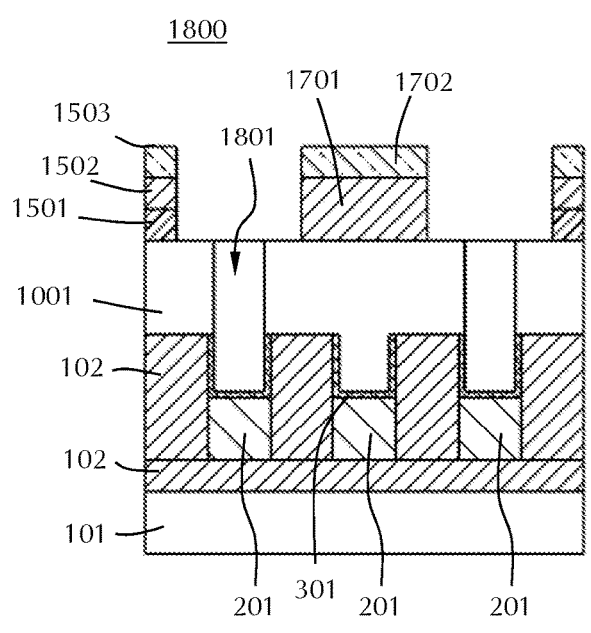
FIG. 18A is a side cross-sectional view of the electronic device structure after etching the stack and third insulating layer to form vias according to some embodiments.
Figure 18B:
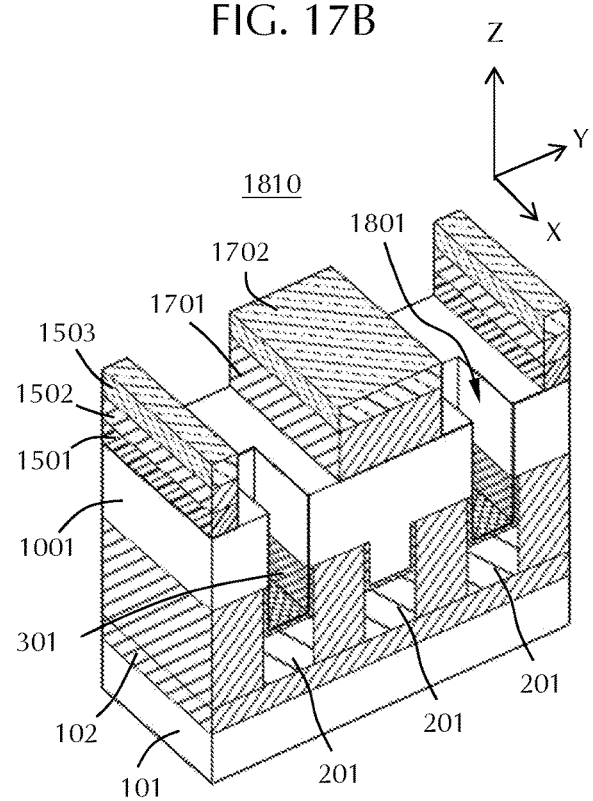
FIG. 18B is a perspective view of the electronic device structure shown in FIG. 18A.

FIG. 18A is a view 1800 and FIG. 18B is a view 1810 that are similar to FIGS. 17A and 17B, respectively, after etching the additional stack 1701 and third insulating layer 1301 from the regions not beneath the mask 1503 or mask 1702. After removal of the third insulating layer 1301, via 1801 is formed in the second insulating layer 1001. The etch process used to remove the third insulating layer 1301 is selective for the third insulating layer 1301 relative to the second insulating material 1001 so that the width of the via 1801 is controlled.

Figure 19A:
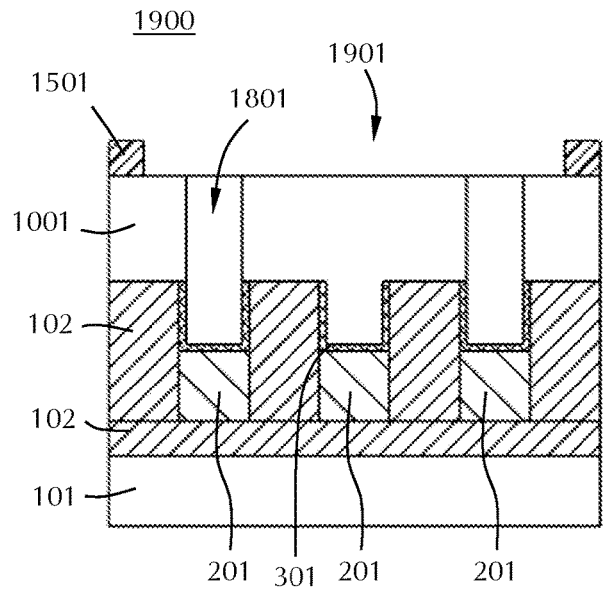
FIG. 19A is a side cross-sectional view of the electronic device structure after removing the stack and mask leaving the vias according to some embodiments.
Figure 19B:
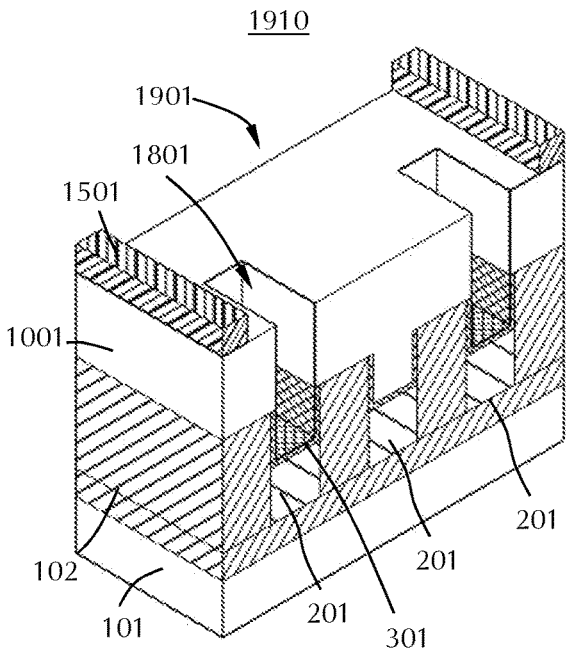
FIG. 19B is a perspective view of the electronic device structure shown in FIG. 19A.

FIG. 19A is a view 1900 and FIG. 19B is a view 1910 that are similar to FIGS. 18A and 18B, respectively, after removing the mask 1503, mask 1702 and stack 1502 leaving via 1801 and trench 1901. The third insulating layer 1301 has been completely removed at this point leaving the second insulating layer 1001 on the first insulating layer 102 and the vias 1801 extending through the second insulating layer 1001.

Figure 20A:
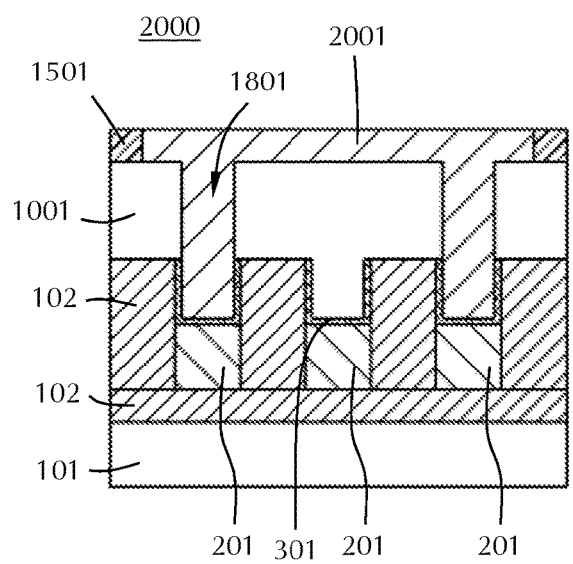
FIG. 20A is a side cross-sectional view of the electronic device structure after forming second conductive lines and filling the vias according to some embodiments.
Figure 20B:
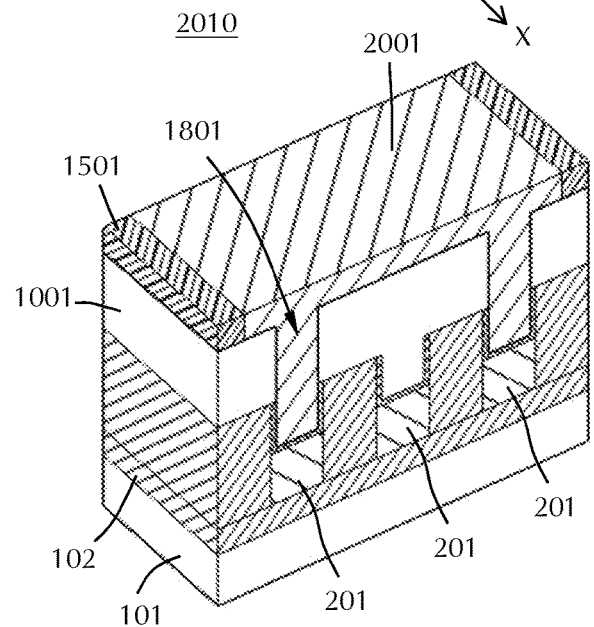
FIG. 20B is a perspective view of the electronic device structure shown in FIG. 20A.

FIG. 20A is a view 2000 and FIG. 20B is a view 2010 that are similar to FIGS. 19A and 19B, respectively, after deposition of second conductive line 2001 in the via 1801 and trench 1901. The second conductive line 2001 can be any suitable metal and can be deposited by any suitable deposition technique. The second conductive line 2001 extends in the second direction which is different than the first direction of the first conductive line 201, as described above.

Figure 21:
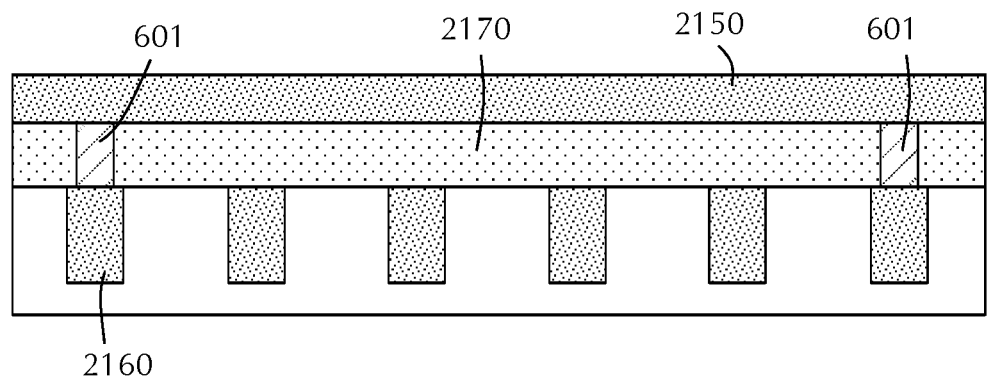
FIG. 21 shows a schematic representation of an electronic device structure formed according to one or more embodiment of the disclosure.

FIG. 21 shows another embodiment of the disclosure. Here, a pillar 601 is grown to form a contact 2150 between gates 2160. A dielectric 2170 prevents direct shorting of adjacent gates 2160. The gate 2160 can be any suitable type of gate known to the skilled artisan. The particular structure of the gate 2160 is not broken down into individual components as the skilled artisan will recognize and know how a suitable gate is formed. In some embodiments, the gate 2160 contact forms one or more conductive lines 103, as shown in FIG. 1, and the process described with respect to the various Figures forms the contact 2150.

FIG. 22 shows a portion of a device 2100 with the fully self-aligned vias in a nested structure. The first conductive lines 201 extend vertically on the page and the second conductive lines 2001 extend horizontally on the page. Vias 1801 are illustrated where the connections between the first conductive lines 201 and the second conductive lines 2001 occur. The packing and arrangement of the conductive lines and vias can be tighter (i.e., higher density) or looser (i.e., lower density) than the embodiment illustrated.

Figure 23:
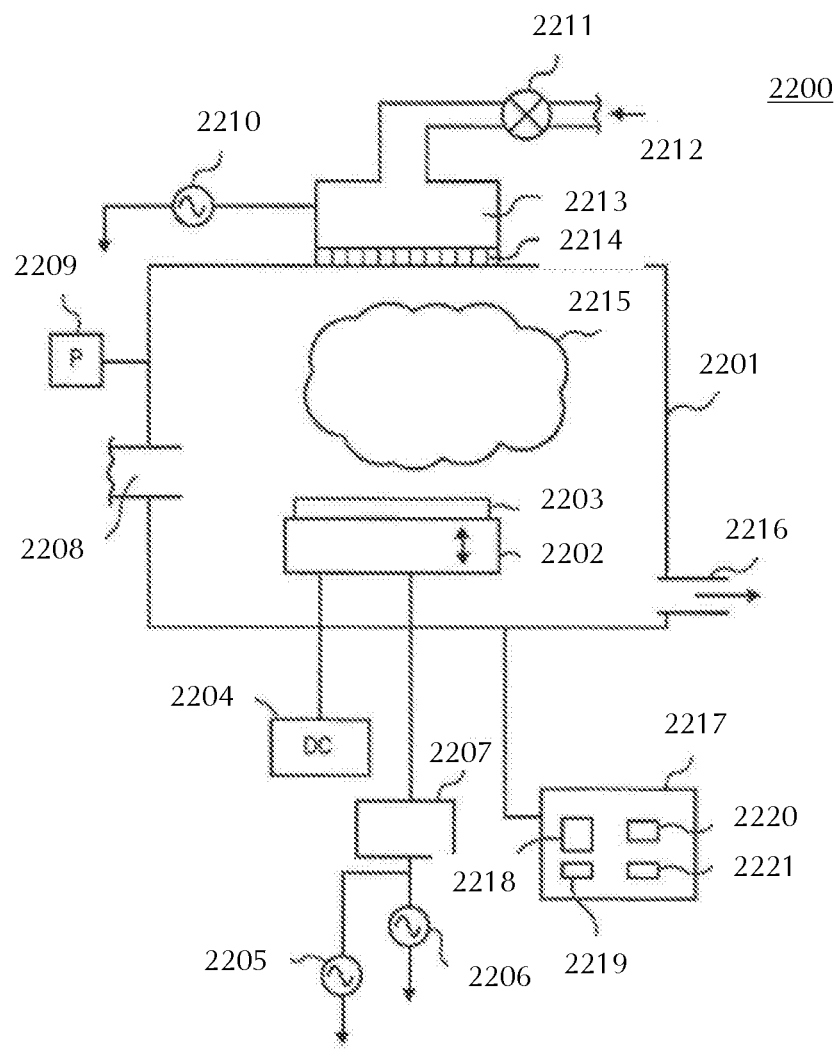
FIG. 23 shows a block diagram of a plasma system in accordance with one or more embodiment of the disclosure.

FIG. 23 shows a block diagram of a plasma system to perform at least some of the operations to provide a fully self-aligned via according to one embodiment. As shown in FIG. 23, system 2200 has a processing chamber 2201. A movable pedestal 2202 to hold an electronic device structure 2203 is placed in processing chamber 2201. Pedestal 2202 comprises an electrostatic chuck ("ESC"), a DC electrode embedded into the ESC, and a cooling/heating base. In an embodiment, pedestal 2202 acts as a moving cathode. In an embodiment, the ESC comprises an $Al_2O_3$ material, $Y_2O_3$, or other ceramic materials known to one of ordinary skill of electronic device manufacturing. A DC power supply 2204 is connected to the DC electrode of the pedestal 2202.

As shown in FIG. 23, an electronic device structure 2203 is loaded through an opening 2208 and placed on the pedestal 2202. The electronic device structure 2203 represents one of the electronic device structures described above. System 2200 comprises an inlet to input one or more process gases 2212 through a mass flow controller 2211 to a plasma source 2213. A plasma source 2213 comprising a showerhead 2214 is coupled to the processing chamber 2201 to receive one or more gases 2212 to generate plasma. Plasma source 2213 is coupled to a RF source power 2210. Plasma source 2213 through showerhead 2214 generates a plasma 2215 in processing chamber 2201 from one or more process gases 2212 using a high frequency electric field. Plasma 2215 comprises plasma particles, such as ions, electrons, radicals or any combination thereof. In an embodiment, power source 2210 supplies power from about 50 W to about 3000 W at a frequency from about 400 kHz to about 162 MHz to generate plasma 2215.

A plasma bias power 2205 is coupled to the pedestal 2202 (e.g., cathode) via a RF match 2207 to energize the plasma. In an embodiment. the plasma bias power 2205 provides a bias power that is not greater than 1000 W at a frequency between about 2 MHz to 60 MHz. and in a particular embodiment at about 13 MHz. A plasma bias power 2206 may also be provided. for example to provide another bias power that is not greater than 1000 W at a frequency from about 400 kHz to about 60 MHz, and in a particular embodiment, at about 60 MHz. Plasma bias power 2206 and bias power 2205 are connected to RF match 2207 to provide a dual frequency bias power. In an embodiment. a total bias power applied to the pedestal 2202 is from about 10 W to about 3000 W.

As shown in FIG. 23, a pressure control system 2209 provides a pressure to processing chamber 2201. As shown in FIG. 23, chamber 2201 has one or more exhaust outlets 2216 to evacuate volatile products produced during processing in the chamber. In an embodiment, the plasma system 2200 is an inductively coupled plasma (ICP) system. In an embodiment, the plasma system 2200 is a capacitively coupled plasma (CCP) system.

A control system 2217 is coupled to the chamber 2201. The control system 2217 comprises a processor 2218, a temperature controller 2219 coupled to the processor 2218, a memory 2220 coupled to the processor 2218 and input/output devices 2221 coupled to the processor 2218 to form fully self-aligned via as described herein. The control system 2217 can also include one or more of circuits, non-transitory memory, transitory memory, electronic media or executable instruction sets as may be used to operate under various configurations.

In one embodiment, the control system 2217, or the processor 2218 within the control system 2217 includes one or more configurations (i.e., executable instruction sets) to process a substrate. The control system 2217 and/or processor 2218 may have one or more configurations to control actions or processes selected from: recessing the first conductive lines, forming a first metal film on the recessed first conductive lines, forming pillars from the first metal film in the recessed first conductive lines, selectively removing some of the pillars and leaving at least one pillar, depositing a second insulating layer around the remaining pillars, removing the remaining pillars to form vias in the second insulating layer, depositing a third insulating layer through the vias onto the recessed first conductive lines to form filled vias, forming an overburden of third insulating layer on the second insulating layer, selectively etching a portion of the overburden from the second insulating layer to expose the second insulating layer and the filled vias and leaving portions of third insulating layer on the second insulating layer, and/or etching the third insulating layer from the filled vias to form a via opening to the first conductive line. In some embodiments, the configuration controls recessing the first conductive lines such that the first conductive lines are recessed in the range of about 10 nm to about 50 nm. In some embodiments, the control system 2217 and/or processor 2218 includes a configuration to deposit a liner on the recessed first conductive lines. In some embodiments, the control system 2217 and/or processor 2218 includes a configuration deposit a second conductive material into the via opening. In some embodiments, the control system 2217 and/or processor 2218 includes a configuration to deposit a plurality of second conductive lines on the second insulating layer and in contact with the second conductive material in the via opening, the second conductive lines extending along a second direction on the second insulating layer.

The control system 2217 is configured to perform at least some of the methods as described herein and may be either software or hardware or a combination of both. The plasma system 2200 may be any type of high performance processing plasma systems known in the art, such as but not limited to an etcher, a cleaner, a furnace, or any other plasma system to manufacture electronic devices.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method to provide a self-aligned via, the method comprising:
   recessing first conductive lines on a first insulating layer on a substrate, the first conductive lines extending along a first direction on the first insulating layer;
   forming a first metal film in the recessed first conductive lines;
   forming pillars from the first metal film in the recessed first conductive lines;
   selectively removing some of the pillars and leaving at least one pillar;
   depositing a second insulating layer around the remaining pillars;
   removing the remaining pillars to form vias in the second insulating layer;
   depositing a third insulating layer in the vias onto the recessed first conductive lines to form filled vias;
   forming an overburden of third insulating layer on the second insulating layer;
   selectively etching a portion of the overburden from the second insulating layer to expose the second insulating layer and the filled vias and leaving portions of third insulating layer on the second insulating layer; and
   etching the third insulating layer from the filled vias to form a via opening to the first conductive line.

2. The method of claim 1, wherein the first conductive lines comprise one or more of cobalt or copper.

3. The method of claim 1, wherein the first conductive lines have a width in the range of about 2 nm to about 15 nm.

4. The method of claim 1, wherein the first insulating layer, the second insulating layer and the third insulating layer are independently selected from: oxides, carbon doped oxides, porous silicon dioxide, nitrides, polymers, phosphosilicate glass, fluorosilicate (SiOF) glass, organosilicate glass (SiOCH), or any combinations thereof.

5. The method of claim 1, wherein the first insulating layer and the second insulating layer are comprised of the same material.

6. The method of claim 1, wherein the first conductive lines are recessed in the range of about 10 nm to about 50 nm.

7. The method of claim 1, further comprising depositing a liner on the recessed first conductive lines onto which the first metal film is formed.

8. The method of claim 7, wherein the liner consists essentially of TiN.

9. The method of claim 1, wherein the first metal film comprises tungsten and wherein the pillars are formed by oxidizing the first metal film to form tungsten oxide.

10. The method of claim 1, wherein the pillars are removed by wet etching with either a solution of HF and $HNO_3$ or a solution of $NH_4OH$ and $H_2O_2$.

11. The method of claim 1, further comprising depositing a second conductive material into the via opening.

12. The method of claim 11, further comprising depositing a plurality of second conductive lines on the second insulating layer and in contact with the second conductive material in the via opening, the second conductive lines extending along a second direction on the second insulating layer.

13. The method of claim 12, wherein the second direction crosses the first direction at an angle in the range of about 30° to about 150°.

14. A method to provide an electronic device with a self-aligned via, the method comprising:
   recessing first conductive lines, comprising copper or cobalt, on a first insulating layer, comprising silicon dioxide, on a substrate, the first conductive lines extending along a first direction on the first insulating layer;
   depositing a liner, comprising TiN, on the recessed first conductive lines;
   forming a first metal film, comprising tungsten, on the liner in the recessed first conductive lines;
   oxidizing the first metal film to form pillars of tungsten oxide in the recessed first conductive lines;
   selectively etching some of the pillars and leaving at least one pillar;
   depositing a second insulating layer around the remaining pillars;
   removing the remaining pillars to form vias in the second insulating layer;
   depositing a third insulating layer in the vias onto the recessed first conductive lines to form filled vias;
   forming an overburden of third insulating layer on the second insulating layer;
   selectively etching a portion of the overburden from the second insulating layer to expose the second insulating layer and the filled vias and leaving portions of third insulating layer on the second insulating layer;
   etching the third insulating layer from the filled vias to form a via opening to the first conductive line;
   depositing a second conductive material into the via opening; and
   depositing a plurality of second conductive lines on the second insulating layer and in contact with the second conductive material in the via opening, the second conductive lines extending along a second direction on the second insulating layer,
   wherein the second direction crosses the first direction at an angle in the range of about 30° to about 150°.

* * * * *